(12) United States Patent
Govindaraju et al.

(10) Patent No.: US 11,756,833 B2
(45) Date of Patent: *Sep. 12, 2023

(54) TECHNIQUES AND CONFIGURATIONS TO REDUCE TRANSISTOR GATE SHORT DEFECTS

(71) Applicant: Intel Corporation, Santa Clara, CA (US)

(72) Inventors: Sridhar Govindaraju, Hillsboro, OR (US); Matthew J. Prince, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/738,968

(22) Filed: May 6, 2022

(65) Prior Publication Data

US 2022/0262684 A1 Aug. 18, 2022

Related U.S. Application Data

(60) Continuation of application No. 17/069,265, filed on Oct. 13, 2020, now Pat. No. 11,380,592, which is a
(Continued)

(51) Int. Cl.
*H01L 21/8234* (2006.01)
*H01L 29/78* (2006.01)
(Continued)

(52) U.S. Cl.
CPC ............ *H01L 21/823437* (2013.01); *H01L 21/31053* (2013.01); *H01L 21/32115* (2013.01);
(Continued)

(58) Field of Classification Search
CPC ....... H01L 21/823437; H01L 21/31053; H01L 21/32115; H01L 21/76805; H01L 21/7684; H01L 21/76895; H01L 21/823431; H01L 21/823462; H01L 21/823475; H01L 23/49838; H01L 23/5329; H01L 23/535; H01L 24/16; H01L 27/0886; H01L 29/42372; H01L 29/4238; H01L 29/66795; H01L 29/785; H01L 21/823871;
(Continued)

(56) References Cited

U.S. PATENT DOCUMENTS 10,847,423 B2 * 11/2020 Govindaraju ..... H01L 21/76895
2005/0093082 A1 5/2005 Son et al.
(Continued)

*Primary Examiner* — Patricia D Valenzuela
(74) *Attorney, Agent, or Firm* — Schwabe, Williamson & Wyatt, P.C.

(57) ABSTRACT

Embodiments of the present disclosure describe techniques and configurations to reduce transistor gate short defects. In one embodiment, a method includes forming a plurality of lines, wherein individual lines of the plurality of lines comprise a gate electrode material, depositing an electrically insulative material to fill regions between the individual lines and subsequent to depositing the electrically insulative material, removing a portion of at least one of the individual lines to isolate gate electrode material of a first transistor device from gate electrode material of a second transistor device. Other embodiments may be described and/or claimed.

23 Claims, 6 Drawing Sheets

Related U.S. Application Data continuation of application No. 16/537,107, filed on Aug. 9, 2019, now Pat. No. 10,847,423, which is a continuation of application No. 15/415,495, filed on Jan. 25, 2017, now Pat. No. 10,468,305, which is a continuation of application No. 15/008,325, filed on Jan. 27, 2016, now Pat. No. 9,761,497, which is a division of application No. 14/137,909, filed on Dec. 20, 2013, now Pat. No. 9,281,401.

(51) Int. Cl.

| | |
|---|---|
| *H01L 29/66* | (2006.01) |
| *H01L 29/423* | (2006.01) |
| *H01L 27/088* | (2006.01) |
| *H01L 21/3105* | (2006.01) |
| *H01L 21/321* | (2006.01) |
| *H01L 21/768* | (2006.01) |
| *H01L 23/498* | (2006.01) |
| *H01L 23/532* | (2006.01) |
| *H01L 23/535* | (2006.01) |
| *H01L 23/00* | (2006.01) |
| *H01L 21/84* | (2006.01) |
| *H01L 29/06* | (2006.01) |
| *H01L 21/8238* | (2006.01) |
| *H01L 27/02* | (2006.01) |
| *H01L 27/12* | (2006.01) |
| *H01L 27/092* | (2006.01) |

(52) U.S. Cl.
CPC .... *H01L 21/7684* (2013.01); *H01L 21/76805* (2013.01); *H01L 21/76895* (2013.01); *H01L 21/823431* (2013.01); *H01L 21/823462* (2013.01); *H01L 21/823475* (2013.01); *H01L 23/49838* (2013.01); *H01L 23/535* (2013.01); *H01L 23/5329* (2013.01); *H01L 24/16* (2013.01); *H01L 27/0886* (2013.01); *H01L 29/4238* (2013.01); *H01L 29/42372* (2013.01); *H01L 29/66795* (2013.01); *H01L 29/785* (2013.01); *H01L 21/823871* (2013.01); *H01L 21/845* (2013.01); *H01L 27/0207* (2013.01); *H01L 27/0924* (2013.01); *H01L 27/1211* (2013.01); *H01L 29/0649* (2013.01); *H01L 2224/16225* (2013.01); *H01L 2224/16227* (2013.01); *H01L 2924/0002* (2013.01)

(58) Field of Classification Search
CPC ............... H01L 21/845; H01L 27/0207; H01L 27/1211; H01L 29/0649; H01L 2224/16225; H01L 2224/16227; H01L 27/0924; H01L 2924/0002
See application file for complete search history.

(56) References Cited

U.S. PATENT DOCUMENTS

| | | |
|---|---|---|
| 2008/0284929 A1 | 11/2008 | Kimura |
| 2011/0068407 A1 | 3/2011 | Yeh et al. |
| 2011/0193157 A1 | 8/2011 | Juengling |
| 2013/0026572 A1 | 1/2013 | Kawa et al. |
| 2013/0228833 A1 | 9/2013 | Xiao et al. |
| 2013/0285155 A1 | 10/2013 | Glass et al. |
| 2013/0334602 A1 | 12/2013 | Guo et al. |
| 2014/0131660 A1* | 5/2014 | Cea ............. H01L 29/1054 438/197 |
| 2014/0361375 A1 | 12/2014 | Deniz |
| 2016/0276467 A1 | 9/2016 | Liu et al. |

\* cited by examiner

TECHNIQUES AND CONFIGURATIONS TO REDUCE TRANSISTOR GATE SHORT DEFECTS

CROSS REFERENCE TO RELATED APPLICATIONS

The present application is a continuation of U.S. patent application Ser. No. 17/069,265, filed Oct. 13, 2020, which is a continuation application of U.S. patent application Ser. No. 16/537,107, filed Aug. 9, 2019, now U.S. Pat. No. 10,847,423, issued Nov. 24, 2020, which is a continuation application of U.S. patent application Ser. No. 15/415,495, filed Jan. 25, 2017, now U.S. Pat. No. 10,468,305, issued Nov. 5, 2019, which is a continuation application of U.S. patent application Ser. No. 15/008,325, filed Jan. 27, 2016, now U.S. Pat. No. 9,761,497, issued Sep. 12, 2017, and entitled "TECHNIQUES AND CONFIGURATIONS TO REDUCE TRANSISTOR GATE SHORT DEFECTS," which is a division of U.S. patent application Ser. No. 14/137,909, filed Dec. 20, 2013, now U.S. Pat. No. 9,281,401, issued Mar. 8, 2016, the entire contents and disclosure of which are hereby incorporated by reference in their entirety and for all purposes.

FIELD

Embodiments of the present disclosure generally relate to the field of integrated circuits, and more particularly, to techniques and configurations to reduce transistor gate short defects.

BACKGROUND

Transistor structures may include gate electrodes and contact electrodes to route electrical energy to or from respective gates and source/drain regions. In some cases, patterning processes used to fabricate such gate electrodes and contact electrodes may result in material of the contact electrodes being deposited in a gate plug region, which may result in defects such as transistor gate short defects. The challenges of shrinking alignment and critical dimension tolerances of these features may further exacerbate such defects between material of gate electrodes and/or contact electrodes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
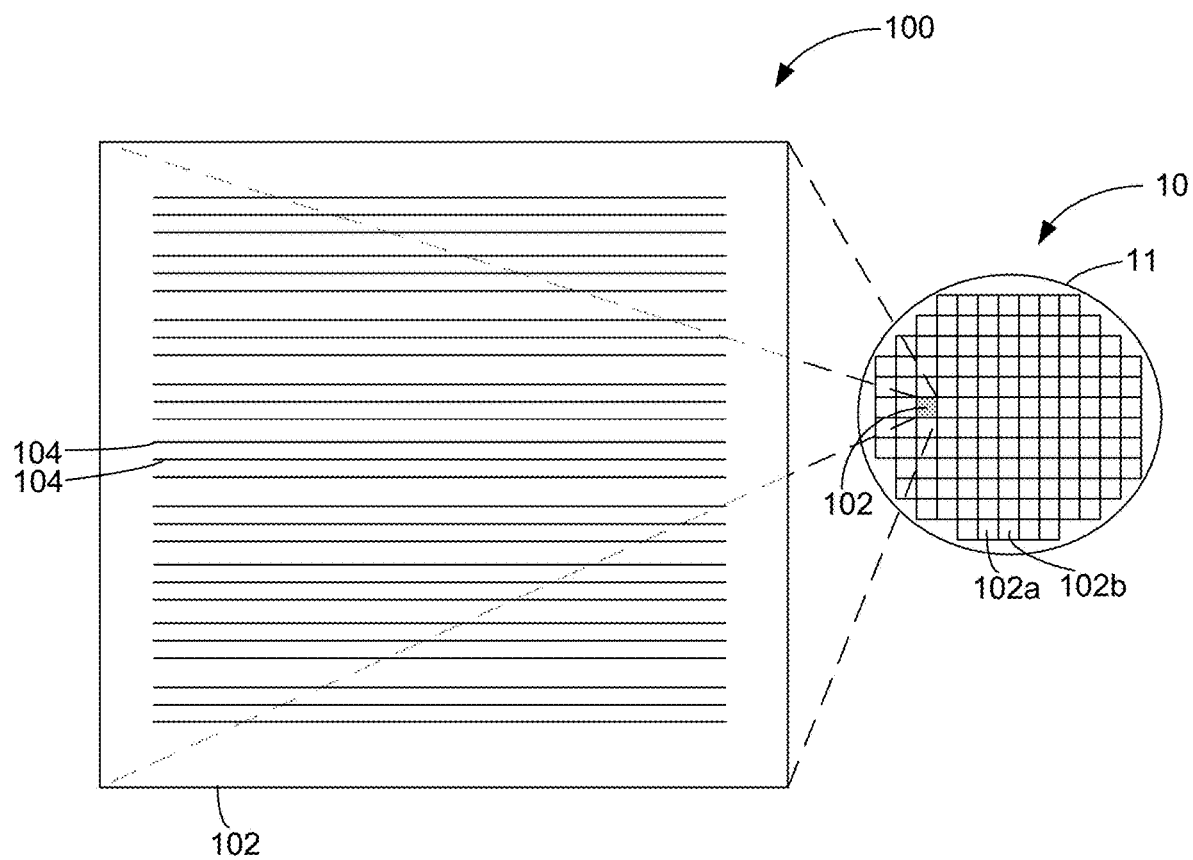
FIG. 1 schematically illustrates a top view of an example die in wafer form and in singulated form, in accordance with some embodiments.

Embodiments of the present disclosure describe techniques and configurations to reduce transistor gate short defects. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a top view of an example die 102 in wafer form 10 and in singulated form 100, in accordance with some embodiments. In some embodiments, the die 102 may be one of a plurality of dies (e.g., dies 102, 102a, 102b) of a wafer 11 composed of semiconductor material such as, for example, silicon or other suitable material. The plurality of dies may be formed on a surface of the wafer 11. Each of the dies may be a repeating unit of a semiconductor product that includes a transistor electrode structure (e.g., transistor electrode structure 300 of FIGS. 3*a-i*) as described herein. For example, the die 102 may include circuitry having transistor elements such as, for example, one or more channel bodies 104 (e.g., fin structures, nanowires, planar bodies, etc.) that provide a channel pathway for mobile charge carriers of one or more transistor devices. The transistor electrode structure described herein may be formed on a channel body to provide a gate electrode for delivery of a threshold voltage and source/drain current to provide the mobile charge carriers for operation of a transistor device. Although the one or more channel bodies 104 are depicted in rows that traverse a substantial portion of the die 102 in FIG. 1 for the sake of simplicity, it is to be understood that one or more channel bodies 104 may be configured in any of a wide variety of other suitable arrangements on the die 102 in other embodiments.

After a fabrication process of the semiconductor product embodied in the dies is complete, the wafer 11 may undergo a singulation process in which each of the dies (e.g., die 102) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the one or more channel bodies 104 may be disposed on a semiconductor substrate in wafer form 10 or singulated form 100. The one or more channel bodies 104 described herein may be incorporated in a die 102 for logic or memory, or combinations thereof. In some embodiments, the one or more channel bodies 104 may be part of a system-on-chip (SoC) assembly.

Figure 2:
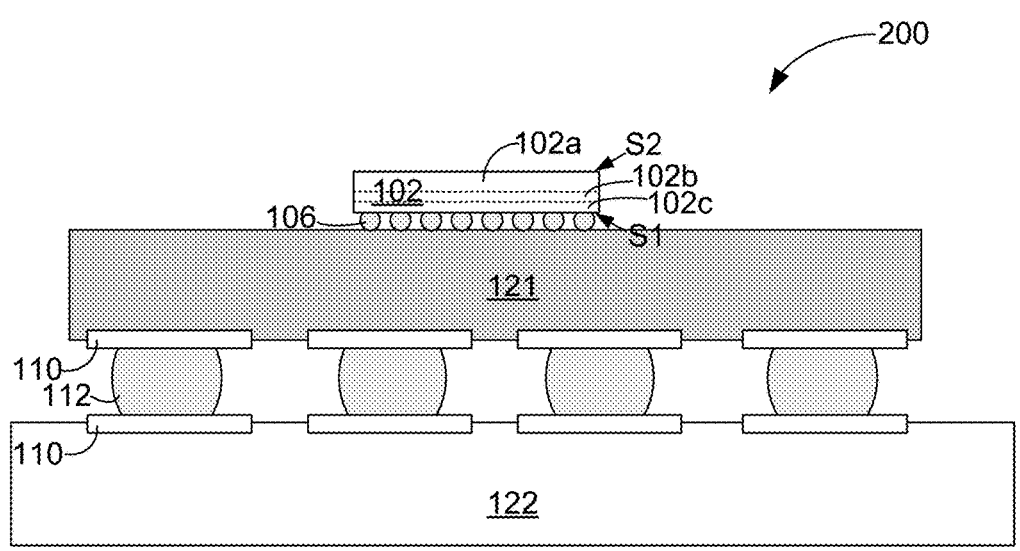
FIG. 2 schematically illustrates a cross-section side view of an integrated circuit (IC) assembly, in accordance with some embodiments.

FIG. 2 schematically illustrates a cross-section side view of an integrated circuit (IC) assembly 200, in accordance with some embodiments. In some embodiments, the IC assembly 200 may include one or more dies (hereinafter "die 102") electrically and/or physically coupled with a package substrate 121. The die 102 may include one or more channel bodies (e.g., one or more channel bodies 104 of FIG. 1) and one or more corresponding transistor electrode structures as described herein formed on the one or more channel bodies. In some embodiments, the package substrate 121 may be electrically coupled with a circuit board 122, as can be seen.

The die 102 may represent a discrete product made from a semiconductor material (e.g., silicon) using semiconductor fabrication techniques such as thin film deposition, lithography, etching and the like used in connection with forming CMOS devices. In some embodiments, the die 102 may be, include, or be a part of a processor, memory, SoC or ASIC in some embodiments. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including circuitry is attached to a surface of the package substrate 121 using die-level interconnect structures 106 such as bumps, pillars, or other suitable structures that may also electrically couple the die 102 with the package substrate 121. The active side S1 of the die 102 may include multi-threshold voltage transistor devices as described herein. An inactive side, S2, may be disposed opposite to the active side S1, as can be seen.

The die 102 may generally include a semiconductor substrate 102*a*, one or more device layers (hereinafter "device layer 102*b*") and one or more interconnect layers (hereinafter "interconnect layer 102*c*"). The semiconductor substrate 102*a* may be substantially composed of a bulk semiconductor material such as, for example silicon, in some embodiments. The device layer 102*b* may represent a region where active devices such as transistor devices are formed on the semiconductor substrate. The device layer 102*b* may include, for example, structures such as channel bodies (e.g., one or more channel bodies 104 of FIG. 1) and/or source/drain regions of transistor devices. The interconnect layer 102*c* may include interconnect structures that are configured to route electrical signals to or from the active devices in the device layer 102*b*. For example, the interconnect layer 102*c* may include trenches and/or vias to provide electrical routing and/or contacts. In some embodiments, the transistor electrode structure described herein (e.g., transistor electrode structure 300 of FIGS. 3*a-i*) may be disposed on transistor features of the device layer 102*b*. The transistor electrode structure may be disposed between and electrically couple the transistor devices of the device layer 102*b* and the interconnect structures of the interconnect layer 102*c*.

In some embodiments, the die-level interconnect structures 106 may be configured to route electrical signals between the die 102 and other electrical devices. The electrical signals may include, for example, input/output (I/O) signals and/or power/ground signals that are used in connection with operation of the die 102.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads or traces (not shown) disposed on one or more surfaces of the package substrate 121 and/or internal routing features (not shown) such as, for example, trenches, vias or other interconnect structures to route electrical signals through the package substrate 121. For example, in some embodiments, the package substrate 121 may include electrical routing features such as pads (not shown) configured to receive the respective die-level interconnect structures 106 of the die 102.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 502 of FIG. 5).

Package-level interconnects such as, for example, solder balls 112 may be coupled to one or more pads (hereinafter "pads 110") on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 121 with the circuit board 122 may be used in other embodiments.

The IC assembly 200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 200 may be used in some embodiments.

FIGS. 3a-i schematically illustrate a top-down view and corresponding cross-section side views of a transistor electrode structure 300 during various stages of fabrication, in accordance with some embodiments. In each of FIGS. 3a-i, the top-down view is depicted on the far left and cross-section side views along lines A-A' and B-B' are depicted to the right of the top-down view, as can be seen. The cross-section views along lines A-A' and B-B' may only depict a region above the device layer 330 and numeric labels presented in the figures may not be duplicated in each of the subsequent figures for the sake of simplicity.

Figure 3A:
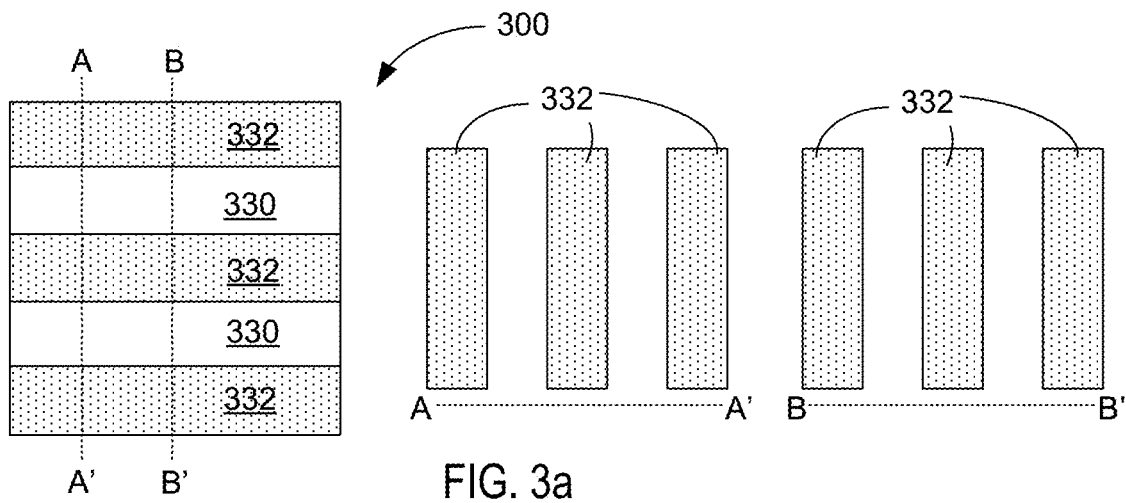
FIGS. 3a-i schematically illustrate a top-down view and corresponding cross-section side views of a transistor electrode structure during various stages of fabrication, in accordance with some embodiments.

Referring to FIG. 3a, a transistor electrode structure 300 is depicted subsequent to forming one or more lines (hereinafter "lines 332") on features of a device layer 330. The device layer 330 may comport with embodiments described in connection with device layer 102b of FIG. 2. The lines 332 may be formed, for example, by depositing a gate electrode material on the device layer 330. For example, the gate electrode material may be blanket-deposited to cover underlying channel bodies and source/drain regions of transistor devices. In an embodiment where the transistor devices are fin-based transistor devices, the channel bodies may include fin structures that extend in a direction (e.g., a direction along lines A-A' or B-B') that is substantially perpendicular with a lengthwise direction of the lines 332. The deposited gate electrode material may be recessed using a suitable process such as, for example, a polish process. The polish process may include, for example, a chemical-mechanical planarization (CMP) process that recesses the deposited gate electrode material to a desired thickness (e.g., to provide a design height of the lines 332). Portions of the gate electrode material may be removed using a patterning process such as, for example, lithography and/or etch processes to form the lines 332. The lines 332 may be parallel to one another in some embodiments, as can be seen.

The gate electrode material may be composed of any suitable electrically conductive material including, for example, one or more metals such as, for example, workfunction metals. According to various embodiments, for a PMOS transistor, metals that may be used for the gate electrode material may include, but are not limited to, ruthenium, palladium, platinum, cobalt, nickel, and conductive metal oxides, e.g., ruthenium oxide. A p-type metal layer may enable the formation of a PMOS gate electrode with a workfunction that is between about 4.9 eV and about 5.2 eV. For an NMOS transistor, metals that may be used for the gate electrode material may include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer may enable the formation of an NMOS gate electrode with a workfunction that is between about 3.9 eV and about 4.2 eV. Other suitable materials may be used to form the lines 332 in other embodiments.

In some embodiments, the gate electrode material of the lines 332 may be deposited on a gate dielectric that is disposed on a channel body of a transistor device. According to various embodiments, the gate dielectric may be formed of a material such as silicon dioxide (SiO2) or a high-k material. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate electrode material of the lines 332 may be deposited on other structures or features of the transistor device such as, for example, spacers, source/drain regions or other well-known features of a transistor device. The lines 332 may be formed according other suitable techniques in other embodiments.

Figure 3B:
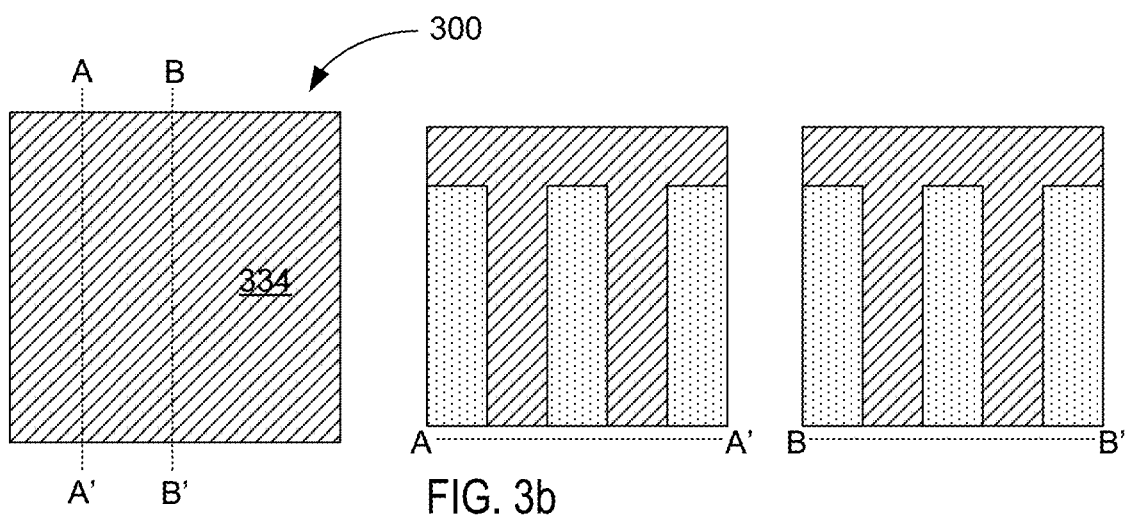

Referring to FIG. 3b, the transistor electrode structure 300 is depicted subsequent to depositing a first electrically insulative material 334 to fill regions between the lines 332, as can be seen. The first electrically insulative material 334 may be composed of a wide variety of suitable materials including, for example, an interlayer dielectric (ILD) material such as silicon oxide.

Figure 3C:
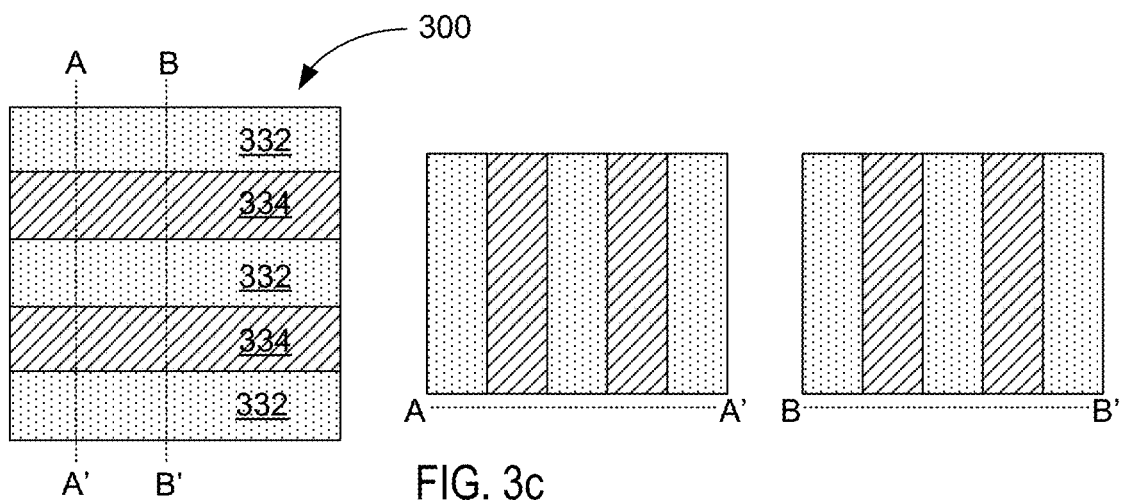

Referring to FIG. 3c, the transistor electrode structure 300 is depicted subsequent to recessing the first electrically insulative material 334 by polishing, as can be seen. The first electrically insulative material 334 may be recessed to provide a surface of the first electrically insulative material 334 that is planar with a respective surface of the gate electrode material of the lines 332, as can be seen in the cross-section side view along lines A-A' and B-B'.

Figure 3D:
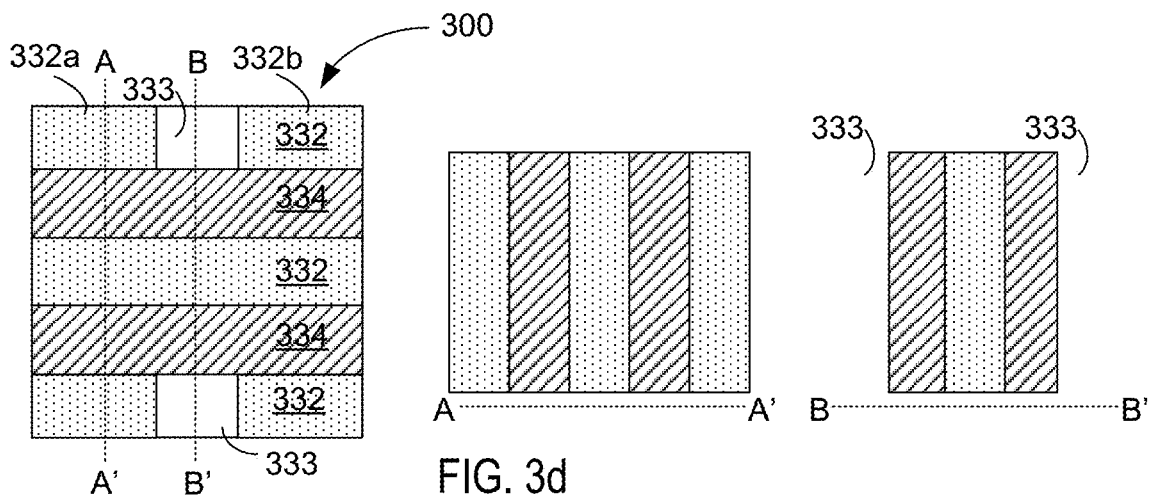

Referring to FIG. 3d, the transistor electrode structure 300 is depicted subsequent to removing a portion of one or more of the lines 332 to form one or more respective openings (hereinafter "openings 333") in the one or more lines 332, as can be seen. Forming the openings 333 may be referred to as a "gate cut" operation. The portion of one or more of the lines 332 may be removed to form the openings 333 in order to isolate gate electrode material of a first transistor device from gate electrode material of a second transistor device. For example, the first transistor device (not shown) may underly a first portion 332a of an individual line of the lines 332 and the second transistor device (not shown) may underly a second portion 332b of the individual line. The openings 333 may be formed using any suitable technique including, for example, a patterning process.

Figure 3E:
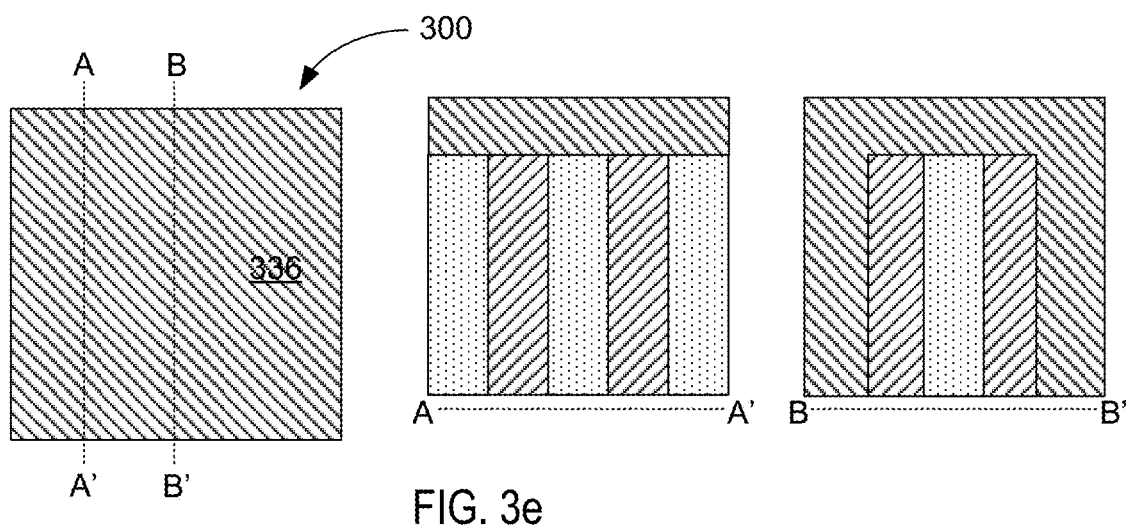

Referring to FIG. 3e, the transistor electrode structure 300 is depicted subsequent to depositing a second electrically insulative material 336 to fill the openings 333, as can be seen. In some embodiments, depositing the second electrically insulative material 336 may be referred to as a "gate plug fill" operation. The second electrically insulative material 336 may isolate gate electrode material of the first portion 332a from gate electrode material of the second portion 332b.

The second electrically insulative material 336 may be composed of any of a wide variety of suitable materials including, for example, silicon nitride in one embodiment. In some embodiments, the second electrically insulative material 336 may have a different chemical composition than the first electrically insulative material 334 to facilitate selective etching in subsequent processes.

Figure 3F:
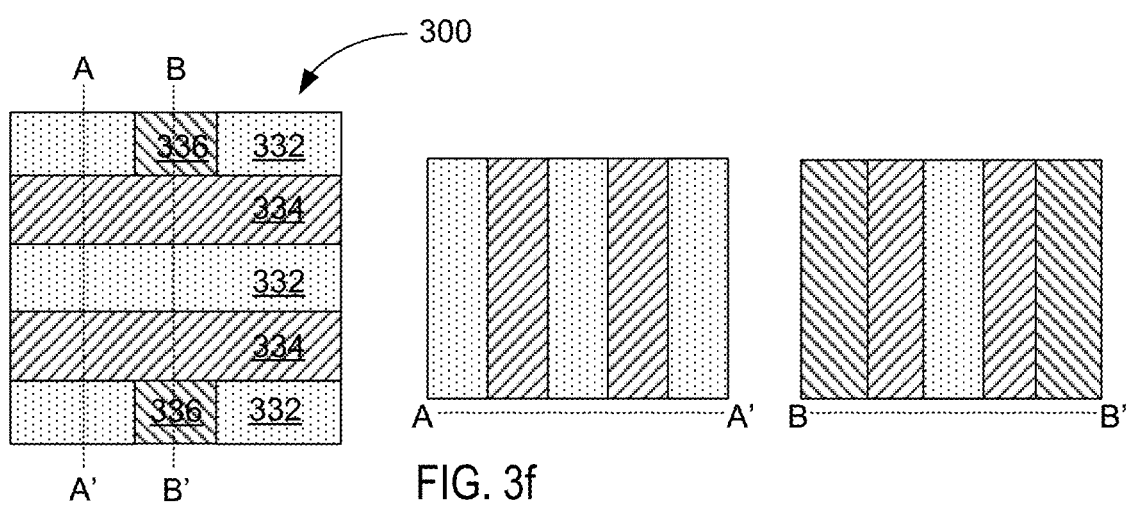

Referring to FIG. 3f, the transistor electrode structure 300 is depicted subsequent to recessing the second electrically insulative material 336 by polishing, as can be seen. The second electrically insulative material 336 may be recessed to provide a surface of the second electrically insulative material 336 that is planar with respective surfaces of the gate electrode material of the lines 332 and the first electrically insulative material 334, as can be seen in the cross-section side view along lines A-A' and B-B'. The second electrically insulative material 336 deposited in the opening 333 may be referred to as a "gate plug" in some embodiments.

Figure 3G:
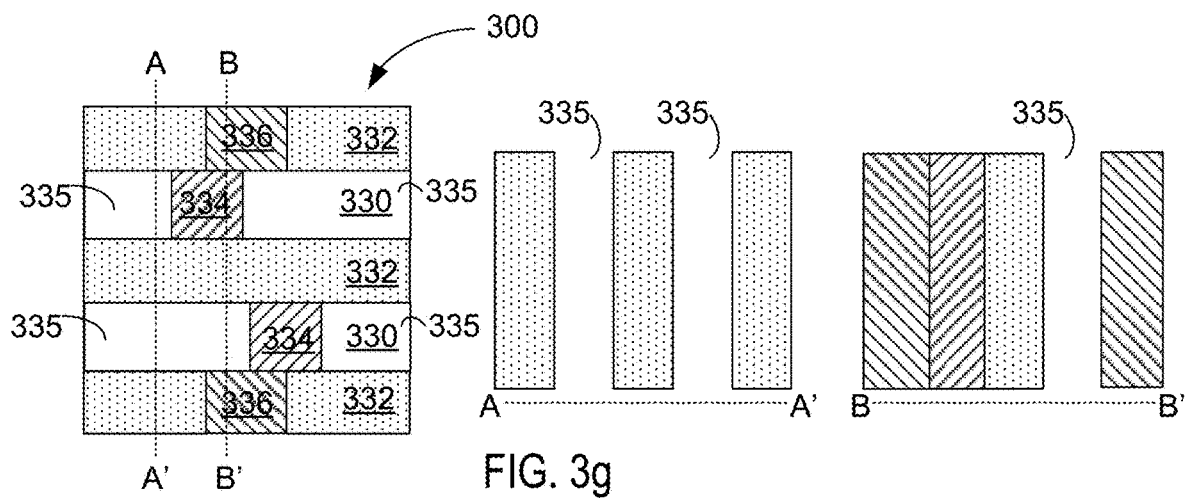

Referring to FIG. 3g, the transistor electrode structure 300 is depicted subsequent to removing portions of the first electrically insulative material 334 to form respective openings (hereinafter "openings 335") in the first electrically insulative material 334 between the lines 332, as can be seen. The openings 335 may be formed using any suitable technique including, for example, a patterning process. In some embodiments, a selective etch process may be used to remove the first electrically insulative material 334 without substantially removing the second electrically insulative material 336. In some embodiments, formation of the openings 335 may expose portions of the second electrically insulative material 336 that were covered by the first electrically insulative material 334 prior to removing the portions of first electrically insulative material 334, as can be seen. Subsequent to removing the portions of the first electrically insulative material 334, remaining portions of the first electrically insulative material 334 may be referred to as a "contact plug," which may be configured to isolate contact electrode material (e.g., source/drain contacts) of discrete transistors devices (e.g., the first transistor device and the second transistor device described in connection with FIG. 3d).

Figure 3H:
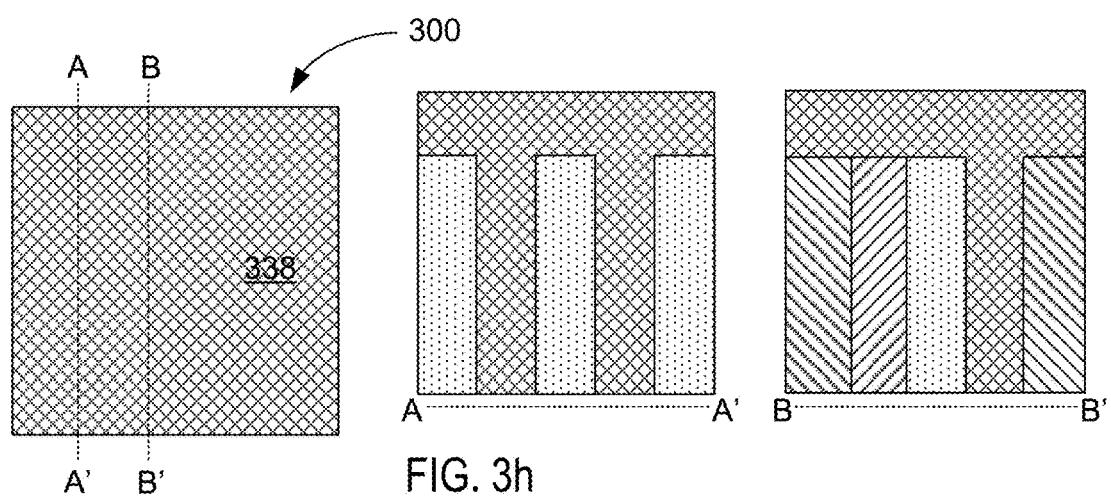

Referring to FIG. 3h, the transistor electrode structure 300 is depicted subsequent to depositing a contact electrode material 338 to fill the openings 335, as can be seen. The deposited contact electrode material 338 may form source and/or drain contacts of discrete transistor devices. According to various embodiments, the contact electrode material 338 may be composed of any of a wide variety of suitable electrically conductive materials such as, for example, one or more metals.

Figure 3I:
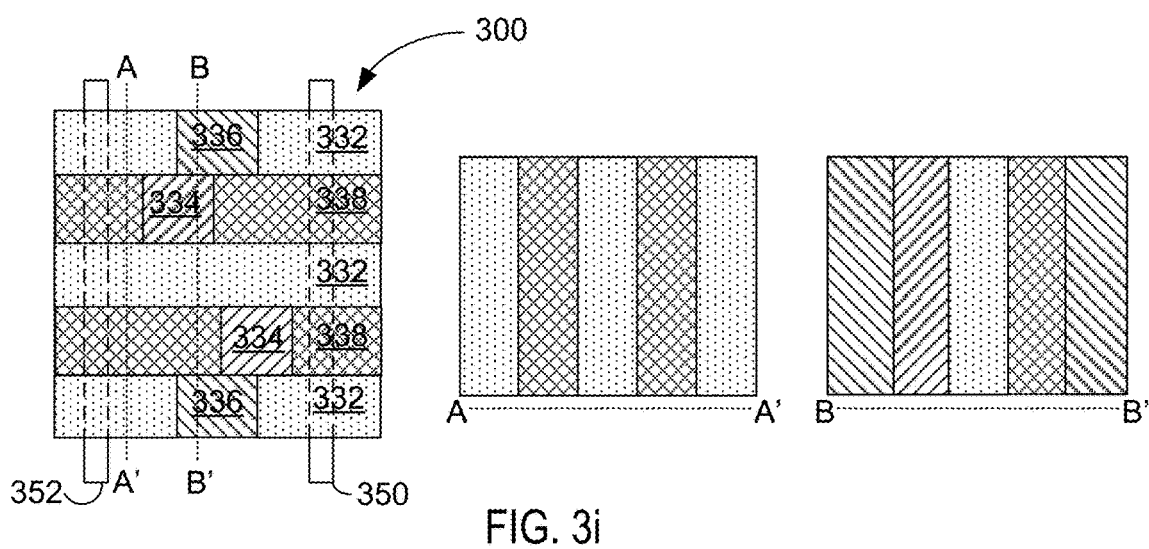

Referring to FIG. 3i, the transistor electrode structure 300 is depicted subsequent to recessing the contact electrode material 338 by polishing, as can be seen. The contact electrode material 338 may be recessed to provide a surface of the contact electrode material 338 that is planar with a respective surfaces of the gate electrode material of the lines 332, the first electrically insulative material 334, and the second electrically insulative material 336 as can be seen in the cross-section side view along lines A-A' and B-B'. In some embodiments, source/drain structures of different transistor devices may be isolated from one another by contact plugs composed of the first electrically insulative material 334 and disposed between portions of the contact electrode material 338, as can be seen.

For example, in embodiments where the transistor electrode structure 300 is formed on fin-based transistor devices, a first fin structure 350 and second fin structure 352 may underly the transistor electrode structure 300, as can be seen. The fin structures 350, 352 may serve as channel bodies of discrete transistors in some embodiments. In these embodiments, transistor structures of a first transistor device may include a portion of the first fin structure 350 and transistor structures of a second transistor device may include a portion of the second fin structure 352. The gate plugs and contact plugs formed by the respective first electrically insulative material 334 and second electrically insulative material 336 may isolate gate electrode material (e.g., of lines 332) and contact electrode material 338 of the first transistor from gate electrode material and contact electrode material 338 of the second transistor. In other embodiments, the transistor electrode structure 300 may be formed on other transistor structures such as, for example, well-known structures of nanowire transistor devices or planar transistor devices.

In some embodiments, at least a portion of the gate plug formed by the first electrically insulative material 334 is in direct contact with the contact plug formed by the second electrically insulative material 336. In some embodiments, at least a portion of the contact electrode material 338 is in direct contact with the gate plug. Other materials and/or structures may be disposed between material structures described in connection with the transistor electrode structure 300. For example, in some embodiments, spacers may be formed according to well-known techniques to electrically isolate the gate electrode material of the lines 332 from the contact electrode material 338.

Forming a transistor electrode structure 300 as described herein may provide a transistor electrode structure 300 with reduced defects such as transistor gate short defects. For example, performing the gate cut operation subsequent to depositing the first electrically insulative material 334 may allow deposition of the second electrically insulative material 336 to form the gate plug. Using different materials for the gate plug and contact plug may reduce a likelihood that material of the gate plug is removed during removal of portions of the first electrically insulative material 334 to form the contact plug, which in turn, may prevent or reduce a likelihood that contact electrode material 338 is deposited in the gate plug region (e.g., the region of the opening 333 directly between the first portion 332a and the second portion 332b of FIG. 3d) and create short defects, as can be seen in FIG. 3i.

Figure 4:
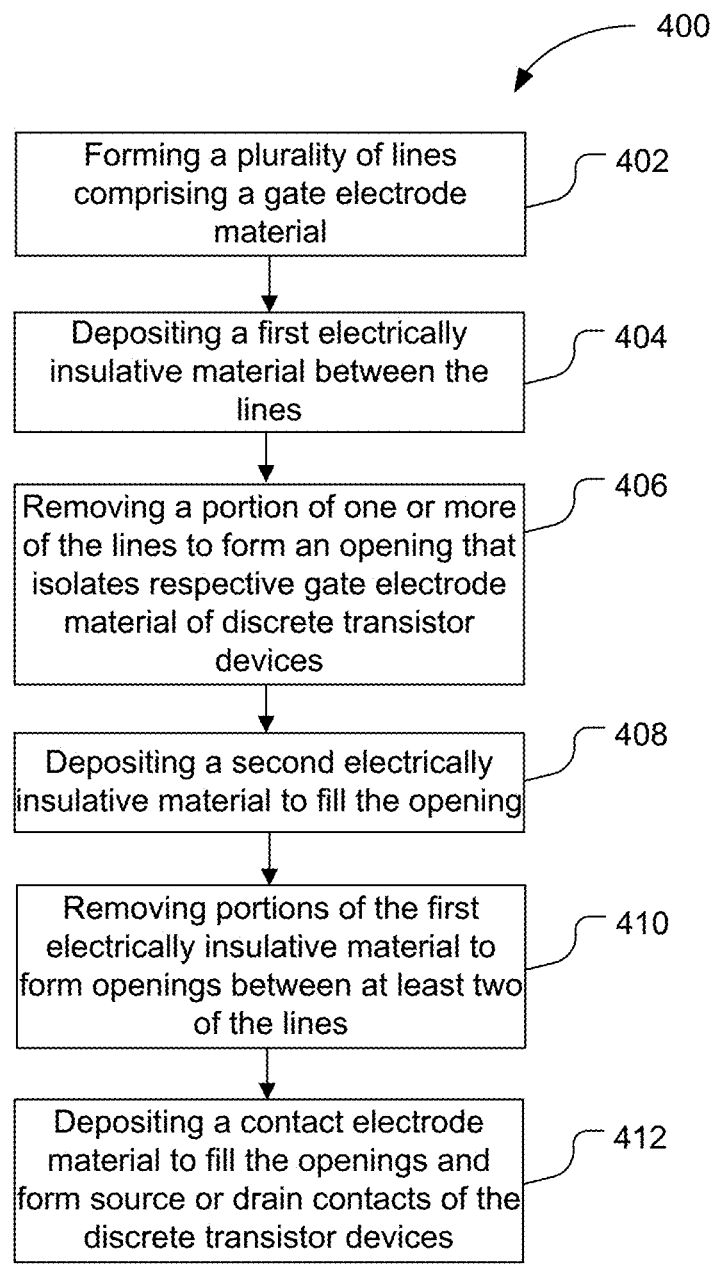
FIG. 4 schematically illustrates a flow diagram for a method of fabricating a transistor electrode structure, in accordance with some embodiments.

FIG. 4 schematically illustrates a flow diagram for a method 400 of fabricating a transistor electrode structure (e.g., transistor electrode structure 300 of FIGS. 3a-i), in accordance with some embodiments. The method 400 may comport with embodiments described in connection with FIGS. 1-3 and vice versa.

At 402, the method 400 may include forming a plurality of lines (e.g., lines 332 of FIG. 3a) comprising a gate electrode material. The lines may be formed, for example, by depositing the gate electrode material over a plurality of transistor structures (e.g., of a device layer 330 of FIG. 3a), polishing the gate electrode material and patterning the gate electrode material.

At 404, the method 400 may include depositing a first electrically insulative material (e.g., first electrically insulative material 334 of FIG. 3b) between the lines. The first electrically insulative material may be deposited using any suitable deposition technique. In some embodiments, a polishing process may be used to recess the first electrically insulative material.

At 406, the method 400 may include removing a portion of one or more of the lines to form an opening (e.g., opening 333 of FIG. 3d) that isolates respective gate electrode material of discrete transistor devices (e.g., a gate cut operation). The portion of the one or more lines may be removed using any suitable technique and may be removed subsequent to depositing the first electrically insulative material at 404 to allow deposition of a different electrically insulative material to form a gate plug in the opening. In some embodiments, removing the portion at 406 may be performed using a patterning process.

At 408, the method 400 may include depositing a second electrically insulative material (e.g., second electrically insulative material 336 of FIG. 3e) to fill the opening. The deposited second electrically insulative material may form a gate plug. In some embodiments, the second electrically insulative material may be deposited to cover the lines and the first electrically insulative material. A polishing process may be used to recess the second electrically insulative material and provide a planar surface.

At 410, the method 400 may include removing portions of the first electrically insulative material to form openings (e.g., openings 335 of FIG. 3g) between at least two of the lines. In some embodiments, the removing the portions of the first electrically insulative material may be performed by a selective etch process that removes the first electrically insulative material at a greater rate than the second electrically insulative material. In some embodiments, the selective etch process removes substantially none of the second electrically insulative material. In some embodiments, the first electrically insulative material may comprise one of silicon oxide or silicon nitride and the second electrically insulative material may comprise silicon oxide if the first electrically insulative material comprises silicon nitride or silicon nitride if the first electrically insulative material comprises silicon oxide. The openings may expose at least a portion of the second electrically insulative material that was covered by the first electrically insulative material prior to removing the portions of the first electrically insulative material. Remaining portions of the first electrically insulative material may be configured to isolate source or drain contacts of discrete transistor devices.

At 412, the method 400 may include depositing a contact electrode material to fill the openings (e.g., openings 335 of FIG. 3g) and form source or drain contacts of the discrete transistor devices. In some embodiments, the contact electrode material may be recessed by a polish process to provide a planar surface.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 5:
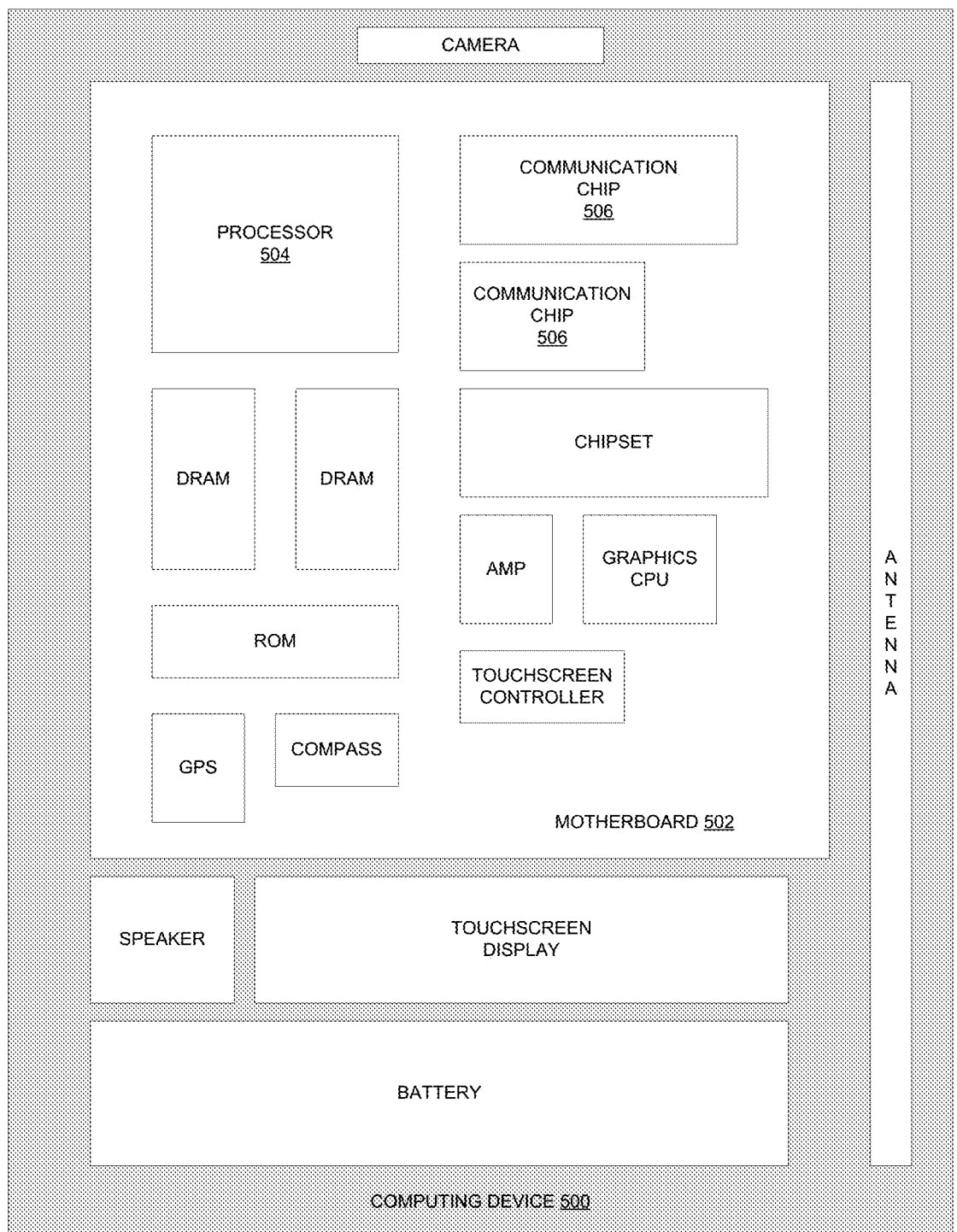
FIG. 5 schematically illustrates an example system that may include a transistor electrode structure as described herein, in accordance with some embodiments.

FIG. 5 schematically illustrates an example system (e.g., computing device 500) that may include a transistor electrode structure (e.g., transistor electrode structure 300 of FIGS. 3a-i) as described herein, in accordance with some embodiments. The motherboard 502 may include a number of components, including but not limited to a processor 504 and at least one communication chip 506. The processor 504 may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other embodiments.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 may include a die (e.g., die 102 of FIGS. 1-2) having a transistor electrode structure (e.g., transistor electrode structure 300 of FIGS. 3*a-i*) as described herein. For example, the die 102 of FIGS. 1-2 may be mounted in a package assembly that is mounted on the motherboard 502. The term "processor" may refer to any device or portion of a device that processes electronic data from registers and/or memory to transform that electronic data into other electronic data that may be stored in registers and/or memory.

The communication chip 506 may also include a die (e.g., die 102 of FIGS. 1-2) having a transistor electrode structure (e.g., transistor electrode structure 300 of FIGS. 3*a-i*) as described herein. In further implementations, another component (e.g., memory device or other integrated circuit device) housed within the computing device 500 may contain a die (e.g., die 102 of FIGS. 1-2) having a transistor electrode structure (e.g., transistor electrode structure 300 of FIGS. 3*a-i*) as described herein.

In various implementations, the computing device 500 may be a mobile computing device, laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Examples

According to various embodiments, the present disclosure describes a method. Example 1 of the method includes forming a plurality of lines, wherein individual lines of the plurality of lines comprise a gate electrode material, depositing an electrically insulative material to fill regions between the individual lines and subsequent to depositing the electrically insulative material, removing a portion of at least one of the individual lines to isolate gate electrode material of a first transistor device from gate electrode material of a second transistor device. Example 2 may include the method of Example 1, wherein forming the plurality of lines comprises depositing the gate electrode material over a plurality of transistor structures including respective transistor structures of the first transistor device and the second transistor device, polishing the gate electrode material and patterning the gate electrode material. Example 3 of the method may include the method of Example 1, wherein the individual lines extend in a direction parallel to one another, the transistor structure of the first transistor device includes a portion of a first fin structure, the transistor structure of the second transistor device includes a portion of a second fin structure and the first fin structure and the second fin structure extend in a direction perpendicular to the individual lines. Example 4 may include the method of Example 1, further comprising prior to removing the portion, polishing the electrically insulative material to provide a surface of the electrically insulative material that is planar with a surface of the gate electrode material. Example 5 may include the method of Example 1, wherein removing the portion is performed by patterning at least one of the individual lines. Example 6 may include the method of any of Examples 1-5, wherein the electrically insulative material is a first electrically insulative material, the method further comprising depositing a second electrically insulative material to fill an opening where the portion of at least one of the individual lines is removed, the second electrically insulative material having a different chemical composition than the first electrically insulative material. Example 7 may include the method of Example 6, wherein depositing the second electrically insulative material comprises depositing the second electrically insulative material to cover the individual lines and the first electrically insulative material, the method further comprising polishing the second electrically insulative material to provide a surface of the second electrically insulative material that is planar with surfaces of the gate electrode material and the first electrically insulative material. Example 8 may include the method of Example 6, further comprising removing portions of the first electrically insulative material to form openings between the individual lines and depositing a contact electrode material to fill the openings and form respective source or drain contacts of at least the first transistor device and the second transistor device. Example 9 may include the method of Example 8, wherein the openings expose at least a portion of the second electrically insulative material that was covered by the first electrically insulative material prior to removing the portions of the first electrically insulative material, removing the portions of the first electrically insulative material is performed by a selective etch process that removes the first electrically insulative material without substantially removing the second electrically insulative material and subsequent to removing the portions of the first electrically insulative material, remaining portions of the first electrically insulative material are configured to isolate source or drain contacts of the first transistor device from source or drain contacts of the second transistor device. Example 10 may include the method of Example 8, further comprising polishing the contact electrode material to provide a surface of the contact electrode material that is planar with respective surfaces of the first electrically insulative material, the second electrically insulative material and the gate electrode material.

According to various embodiments, the present disclosure describes an apparatus. Example 11 of an apparatus may include a plurality of lines, wherein individual lines of the plurality of lines comprise a gate electrode material, a gate plug disposed between a first portion of a first individual line of the individual lines and a second portion of the first individual line to isolate gate electrode material of a first transistor device from gate electrode material of a second transistor device, a contact electrode material disposed between the first individual line and a second individual line of the individual lines and a contact plug disposed between the first individual line and the second individual line to isolate source or drain contacts of the first transistor device from source or drain contacts of the second transistor device, wherein the contact plug comprises a first electrically insulative material and the gate plug comprises a second electrically insulative material that has a different chemical composition than the first electrically insulative material. Example 12 may include the apparatus of Example 11, wherein at least a portion of the gate plug is in direct contact with the contact plug. Example 13 may include the apparatus of Example 13, wherein at least a portion of the contact electrode material is in direct contact with the gate plug. Example 14 may include the apparatus of any of Examples 11-13, wherein the contact electrode material is not disposed directly between the first portion and the second portion of the first individual line. Example 15 may include the apparatus of any of Examples 11-13, wherein the first transistor device and the second transistor device are fin-based transistor devices. Example 16 may include the apparatus of any of Examples 11-13, wherein the first electrically insulative material comprises silicon oxide and the second electrically insulative material comprises silicon nitride.

According to various embodiments, the present disclosure describes a system (e.g., a computing device). Example 17 of a computing device may include a circuit board and a die coupled with the circuit board, the die including a plurality of lines, wherein individual lines of the plurality of lines comprise a gate electrode material, a gate plug disposed between a first portion of a first individual line of the individual lines and a second portion of the first individual line to isolate gate electrode material of a first transistor device from gate electrode material of a second transistor device, a contact electrode material disposed between the first individual line and a second individual line of the individual lines, and a contact plug disposed between the first individual line and the second individual line to isolate source or drain contacts of the first transistor device from source or drain contacts of the second transistor device, wherein the contact plug comprises a first electrically insulative material and the gate plug comprises a second electrically insulative material that has a different chemical composition than the first electrically insulative material. Example 18 may include the computing device of Example 17, wherein at least a portion of the gate plug is in direct contact with the contact plug. Example 19 may include the computing device of Example 18, wherein at least a portion of the contact electrode material is in direct contact with the gate plug. Example 20 may include the computing device of any of Examples 17-19, wherein the die is a processor and the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit structure, comprising:
a first gate electrode, the first gate electrode having a long axis and a width, the long axis along a direction;
a second gate electrode, the second gate electrode having a long axis and a width, the long axis along the direction, wherein the long axis of the first gate structure and the long axis of the second gate structure are along a same first central axis;
a gate plug between the first gate electrode and the second gate electrode;
a first contact electrode, the first contact electrode having a long axis and a width, the long axis along the direction;
a second contact electrode, the second contact electrode having a long axis and a width, the long axis along the direction, wherein the long axis of the first contact electrode and the long axis of the second contact electrode are along a same second central axis; and
a contact plug between and in direct contact with the first contact electrode and the second contact electrode, wherein the contact plug is in contact with the gate plug.

2. The integrated circuit structure of claim 1, further comprising:
a first fin structure having a long axis and a width, the long axis along a second direction, the second direction orthogonal to the direction, wherein the first gate electrode is over the first fin structure, and wherein the first contact electrode is over the first fin structure;
a second fin structure having a long axis and a width, the long axis along the second direction, wherein the second gate electrode is over the second fin structure, and wherein the second contact electrode is over the second fin structure.

3. The integrated circuit structure of claim 2, further comprising:
a third gate electrode over the first fin structure, the third gate electrode having a long axis and a width, the long axis along the direction; and
a fourth gate electrode over the second fin structure, the fourth gate electrode having a long axis and a width, the long axis along the direction, wherein the long axis of the third gate electrode and the long axis of the fourth gate electrode are along a same third central axis.

4. The integrated circuit structure of claim 3, further comprising:
a third contact electrode over the first fin structure, the third contact electrode having a long axis and a width, the long axis along the direction; and
a fourth contact electrode over the second fin structure, the fourth contact electrode having a long axis and a width, the long axis along the direction, wherein the long axis of the third contact electrode and the long axis of the fourth contact electrode are along a same fourth central axis.

5. The integrated circuit structure of claim 2, further comprising:
a first gate dielectric layer between the first fin structure and the first gate electrode; and
a second gate dielectric layer between the second fin structure and the second gate electrode.

6. The integrated circuit structure of claim 1, wherein the gate plug has a width no greater than the width of the first gate electrode and no greater than the width of the second gate electrode.

7. The integrated circuit structure of claim 1, wherein the contact plug has a chemical composition different than a chemical composition of the gate plug.

8. The integrated circuit structure of claim 1, further comprising:
a first nanowire structure having a long axis and a width, the long axis along a second direction, the second direction orthogonal to the direction, wherein the first gate electrode is over the first nanowire structure, and wherein the first contact electrode is over the first nanowire structure;
a second nanowire structure having a long axis and a width, the long axis along the second direction, wherein the second gate electrode is over the second nanowire structure, and wherein the second contact electrode is over the second nanowire structure.

9. An integrated circuit structure, comprising:
a first channel body having a long axis and a width, the long axis along a first direction;
a second channel body having a long axis and a width, the long axis along the first direction;
a first gate electrode over the first channel body, the first gate electrode having a long axis and a width, the long axis along a second direction orthogonal to the first direction, and the width along the first direction;
a second gate electrode over the second channel body, the second gate electrode having a long axis and a width, the long axis along the second direction, and the width along the first direction, wherein the long axis of the first gate structure and the long axis of the second gate structure are along a same first central axis;
an insulating material between the first gate electrode and the second gate electrode, the insulating material having a first chemical composition;
a first contact electrode over the first channel body, the first contact electrode having a long axis and a width, the long axis along the second direction;
a second contact electrode over the second channel body, the second contact electrode having a long axis and a width, the long axis along the second direction, wherein the long axis of the first contact electrode and the long axis of the second contact electrode are along a same second central axis; and
a contact plug between and in direct contact with the first contact electrode and the second contact electrode, the contact plug having a second chemical composition different than the first chemical composition, wherein the contact plug is in contact with the insulating material.

10. The integrated circuit structure of claim 9, wherein the first channel body is a first nanowire, and the second channel body is second nanowire.

11. The integrated circuit structure of claim 9, wherein the first channel body is a first fin structure, and the second channel body is second fin structure.

12. The integrated circuit structure of claim 9, further comprising:
a third gate electrode over the first channel body, the third gate electrode having a long axis and a width, the long axis along the second direction; and
a fourth gate electrode over the second channel body, the fourth gate electrode having a long axis and a width, the long axis along the second direction, wherein the long axis of the third gate electrode and the long axis of the fourth gate electrode are along a same third central axis.

13. The integrated circuit structure of claim 12, further comprising:
a third contact electrode over the first channel body, the third contact electrode having a long axis and a width, the long axis along the second direction; and
a fourth contact electrode over the second fin structure, the fourth contact electrode having a long axis and a width, the long axis along the second direction, wherein the long axis of the third contact electrode and the long axis of the fourth contact electrode are along a same fourth central axis.

14. The integrated circuit structure of claim 9, further comprising:
a third contact electrode over the first channel body, the third contact electrode having a long axis and a width, the long axis along the second direction; and
a fourth contact electrode over the second channel body, the fourth contact electrode having a long axis and a width, the long axis along the second direction, wherein the long axis of the third contact electrode and the long axis of the fourth contact electrode are along a same third central axis.

15. The integrated circuit structure of claim 9, further comprising:
a first gate dielectric layer between the first channel body and the first gate electrode; and
a second gate dielectric layer between the second channel body and the second gate electrode.

16. The integrated circuit structure of claim 9, wherein the insulating material has a width no greater than the width of the first gate electrode and no greater than the width of the second gate electrode.

17. A computing device, comprising:
a board; and
a component coupled to the board, the component including an integrated circuit structure, comprising:
a first gate electrode, the first gate electrode having a long axis and a width, the long axis along a direction;
a second gate electrode, the second gate electrode having a long axis and a width, the long axis along the direction, wherein the long axis of the first gate structure and the long axis of the second gate structure are along a same first central axis;
a gate plug between the first gate electrode and the second gate electrode;
a first contact electrode, the first contact electrode having a long axis and a width, the long axis along the direction;
a second contact electrode, the second contact electrode having a long axis and a width, the long axis along the direction, wherein the long axis of the first contact electrode and the long axis of the second contact electrode are along a same second central axis; and
a contact plug between and in direct contact with the first contact electrode and the second contact electrode, wherein the contact plug is in contact with the gate plug.

18. The computing device of claim 17, further comprising:
a memory coupled to the board.

19. The computing device of claim 17, further comprising:
a communication chip coupled to the board.

20. The computing device of claim 17, wherein the component is a packaged integrated circuit die.

21. The computing device of claim 17, wherein the component is selected from the group consisting of a processor, a communications chip, and a digital signal processor.

22. The computing device of claim 17, the integrated circuit structure further comprising:
a first fin structure having a long axis and a width, the long axis along a second direction, the second direction orthogonal to the direction, wherein the first gate electrode is over the first fin structure, and wherein the first contact electrode is over the first fin structure;
a second fin structure having a long axis and a width, the long axis along the second direction, wherein the second gate electrode is over the second fin structure, and wherein the second contact electrode is over the second fin structure.

23. The computing device of claim 17, the integrated circuit structure further comprising:
a first nanowire structure having a long axis and a width, the long axis along a second direction, the second direction orthogonal to the direction, wherein the first gate electrode is over the first nanowire structure, and wherein the first contact electrode is over the first nanowire structure;

a second nanowire structure having a long axis and a width, the long axis along the second direction, wherein the second gate electrode is over the second nanowire structure, and wherein the second contact electrode is over the second nanowire structure.

\* \* \* \* \*